United States Patent
Glick et al.

[11] Patent Number: 5,944,043
[45] Date of Patent: Aug. 31, 1999

[54] ISOLATION AND PROTECTION SYSTEM FOR PREVENTING A SOURCE OF ULTRA-PURIFIED WATER FROM BEING CONTAMINATED WITH CHEMICALS

[75] Inventors: Jeffrey S. Glick, Cupertino; Randolph M. Fox, Fremont, both of Calif.

[73] Assignee: Advanced Micro Devices, Inc., Sunnyvale, Calif.

[21] Appl. No.: 09/134,824

[22] Filed: Aug. 17, 1998

[51] Int. Cl.⁶ .................................................. E03B 1/00
[52] U.S. Cl. ............................. 137/1; 137/240; 137/597
[58] Field of Search ................... 137/1, 597, 240

[56] References Cited

U.S. PATENT DOCUMENTS

| | | | |
|---|---|---|---|
| 4,846,212 | 7/1989 | Scobie et al. | 137/240 |
| 4,869,301 | 9/1989 | Ohmi et al. | 137/240 X |
| 5,398,712 | 3/1995 | Wang et al. | 137/240 X |
| 5,727,589 | 3/1998 | Yokogi | 137/240 |

*Primary Examiner*—Denise L. Ferensic
*Assistant Examiner*—Ramyar Farid
*Attorney, Agent, or Firm*—Davis Chin

[57] ABSTRACT

A method and system for preventing a source of ultra-purified water from being contaminated with chemicals includes a source of ultra-purified water and a reservoir containing a chemical source. The reservoir has a chemical delivery valve and a chemical outlet pipe coupled to a chemical delivery line for supplying chemicals to a process chamber during a chemical delivery mode of operation. A first controllable inlet valve has its outlet coupled to the chemical delivery line and the source of ultra-purified water for supplying the ultra-purified water from the source of ultra-purified water to the process chamber during a flushing mode of operation. A second controllable inlet valve has an outlet coupled to the inlet of the first controllable inlet valve and an inlet coupled to the source of ultra-purified water. A source of gas under pressure is coupled between the outlet of the second controllable inlet valve and the inlet of said first controllable inlet valve for creating a virtual air gap. As a result, there is prevented the backflow of the chemical source from the reservoir into the source of ultra-purified water causing contamination thereof during the chemical delivery mode of operation.

12 Claims, 3 Drawing Sheets

ISOLATION AND PROTECTION SYSTEM FOR PREVENTING A SOURCE OF ULTRA-PURIFIED WATER FROM BEING CONTAMINATED WITH CHEMICALS

This invention relates generally to wet chemical processing equipment and more particularly, it relates to an improved isolation and protection system for preventing a source of ultra-purified water from being contaminated with chemicals used in chemical processing equipment.

As is generally known in the semiconductor wafer fabrication industry, various chemicals are used in the fabricating process of semiconductor integrated circuits so as to remove particles therefrom or to etch layers of materials from wafers and/or equipment. In particular, there is typically required wet process cleaning and chemical distribution applications in the semiconductor wafer fabrication facilities. As shown in FIG. 1, there is illustrated a prior art system 110 for supplying a ultra-purified water (UPW) source 112 from a factory such as a chemical plant or treatment plant to a process chamber 114 via a chemical delivery line 115. The UPW source is used to flush and/or rinse the chemical delivery line 115 and the process chamber 114 after the chemicals therein have been drained.

The UPW source 112 is fed to one end of a UPW supply or outlet pipe 116 whose other end is joined to a water connection joint 118. A water connecting valve 126 has its one end connected also to the water connection joint 118 via a pipe 125. The other end 127 of the water connecting valve 126 is connected to the process chamber 114 via a water/chemical connection joint 120 and the chemical delivery line 115. A pressurized reservoir 122 containing a source of chemicals is connected to one end of a chemical delivery valve 124 via a chemical outlet pipe 128. The other end of the chemical delivery valve 124 is also connected to the water/chemical connection joint 120.

The water connection joint 118 is also connected to the UPW source 112 via a UPW return or inlet pipe 132.

The water connecting valve 126 and the chemical delivery valve 124 are selectively opened and closed to allow switching between a chemical delivery mode of operation and a flushing/rinsing mode of operation. When the water connecting valve 126 is closed and the chemical delivery valve 124 is opened, this is referred to as the "chemical delivery mode" in which the chemical source from the reservoir 122 is being supplied to the process chamber. When the water connecting valve 126 is opened and the chemical delivery valve 124 is closed, this is referred to as the "flushing/rinsing" mode in which the UPW is being supplied to the chemical delivery line 115 and the process chamber 114 so as to flush and/or rinse the same after the chemicals therein have been removed or drained.

It should be clearly understood that in either mode of operation the UPW is flowing continuously through the pipes 116 and 132 so as to maintain its constant movement.

In order to prevent the UPW source 112 and/or pipes 116 and 132 from potential contamination from the chemicals in the reservoir 122 during the chemical delivery mode of operation, it is generally required by semiconductor fabrication equipment purchasers that the inlet pipe and outlet pipe of the UPW source be isolated from all other fluids by either an air gap or a nitrogen blanket. In other words, the UPW supply or outlet pipe 116 and the UPW return or inlet pipe 132 may not be connected directly to the chemical source in the pressurized reservoir 122. One known prior art solution of meeting this requirement is depicted in FIG. 2.

As can be seen, the system 210 of FIG. 2 includes all of the same components of FIG. 1 and has further added a holding tank 212 and a positive displacement pump 214, which are interconnected between the other end 127 of the water connecting valve 126 and the water/chemical connection joint 120. The holding tank 212 serves to provide an air gap 216 so as to insure that no chemicals from the reservoir 122 can leak back into the UPW source 112, thereby contaminating the same if the water connecting valve 126 were to malfunction or fail.

However, this prior art solution of FIG. 2, as just described, has several drawbacks due to the fact that it requires the installation of a holding tank and a pump in order to prevent the possible contamination of the UPW source. Due to space limitations in most semiconductor wafer fabrication facilities, the necessity of providing relatively large additional components in this design makes it quite inconvenient or difficult to achieve. Further, these extra components are quite cumbersome, complicated and expensive and thus will increase the overall manufacturing cost.

Therefore, there still exists a need of an isolation and protection system for preventing a source of ultra-purified water from being contaminated with chemicals used in chemical processing equipment. The present invention represents a significant improvement over the prior art of FIG. 2 for protecting the UPW source from contamination on an effective and efficient basis.

SUMMARY OF THE INVENTION

Accordingly, it is a general object of the present invention to provide an improved isolation and protection system which overcomes all of the aforementioned problems, but yet is relatively simpler in its construction and is more economical to manufacture and assemble.

It is an object of the present invention to provide an improved isolation and protection system and a method for preventing a source of ultra-purified water from being contaminated with chemicals which does not require the use of holding tanks and/or pumps.

It is another object of the present invention to provide an improved isolation and protection system and method for preventing a source of ultra-purified water from being contaminated with chemicals which is relatively low in cost and occupies a smaller amount of space than is traditionally available.

It is still another object of the present invention to provide an improved isolation and protection system for preventing an ultra-purified water source from being contaminated which includes means for creating a virtual air gap disposed between the UPW source and a pressurized chemical source.

In accordance with the aims and objectives of the present invention, there is provided the provision of an improved isolation and protection system for preventing a source of ultra-purified water from being contaminated with chemicals which includes a source of ultra-purified water and a reservoir containing a chemical source. The reservoir has a chemical delivery valve and a chemical outlet pipe coupled to a chemical delivery line for supplying chemicals to a process chamber during a chemical delivery mode of operation. A first controllable inlet valve has its outlet coupled to the chemical delivery line and the source of ultra-purified water for supplying the ultra-purified water from the source of ultra-purified water to the process chamber during a flushing mode of operation and an inlet. A second controllable inlet valve has an outlet coupled to the inlet of the first controllable inlet valve and an inlet coupled to the source of ultra-purified water. A source of gas under pressure is coupled between the outlet of the second controllable inlet valve and the inlet of the first controllable inlet valve for creating a virtual air gap. As a result, there is prevented the back flow of the chemical source from the reservoir into the source of ultra-purified water causing contamination thereof during the chemical delivery mode of operation.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
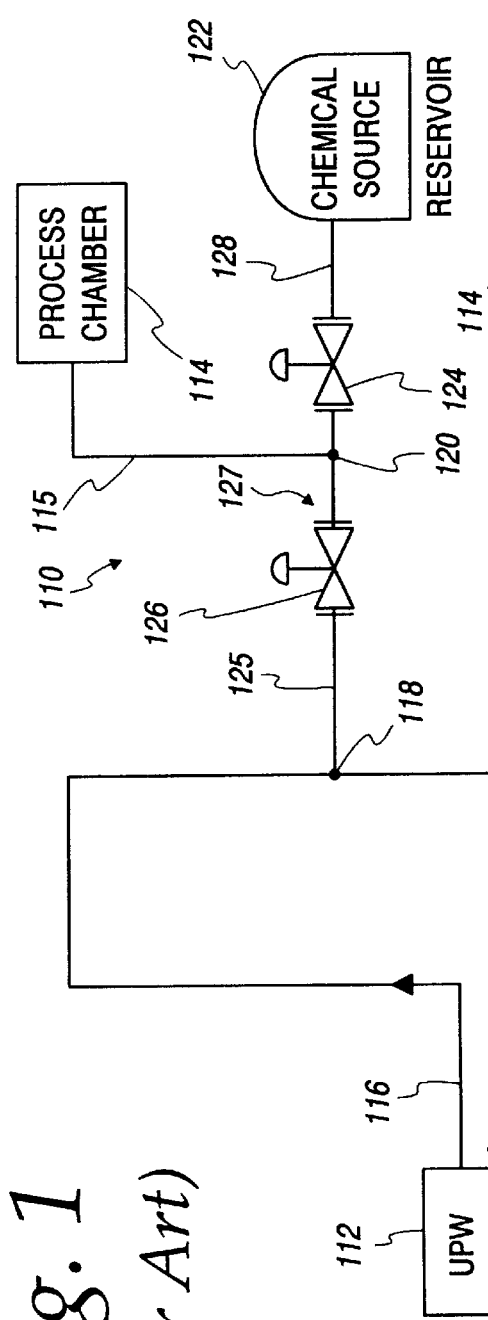
FIG. 1 is a schematic circuit diagram of a prior art system for supplying a UPW source to a process chamber via a chemical delivery line.
Figure 2:
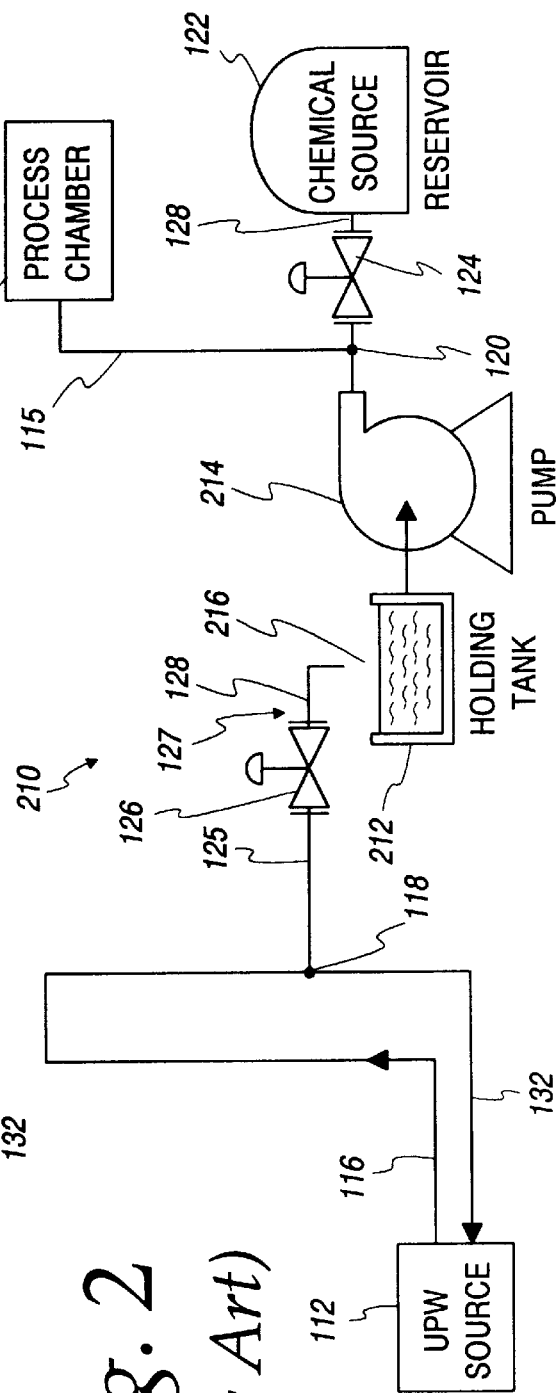
FIG. 2 is a schematic diagram of a prior art system for protecting the UPW source from contamination.
Figure 3:
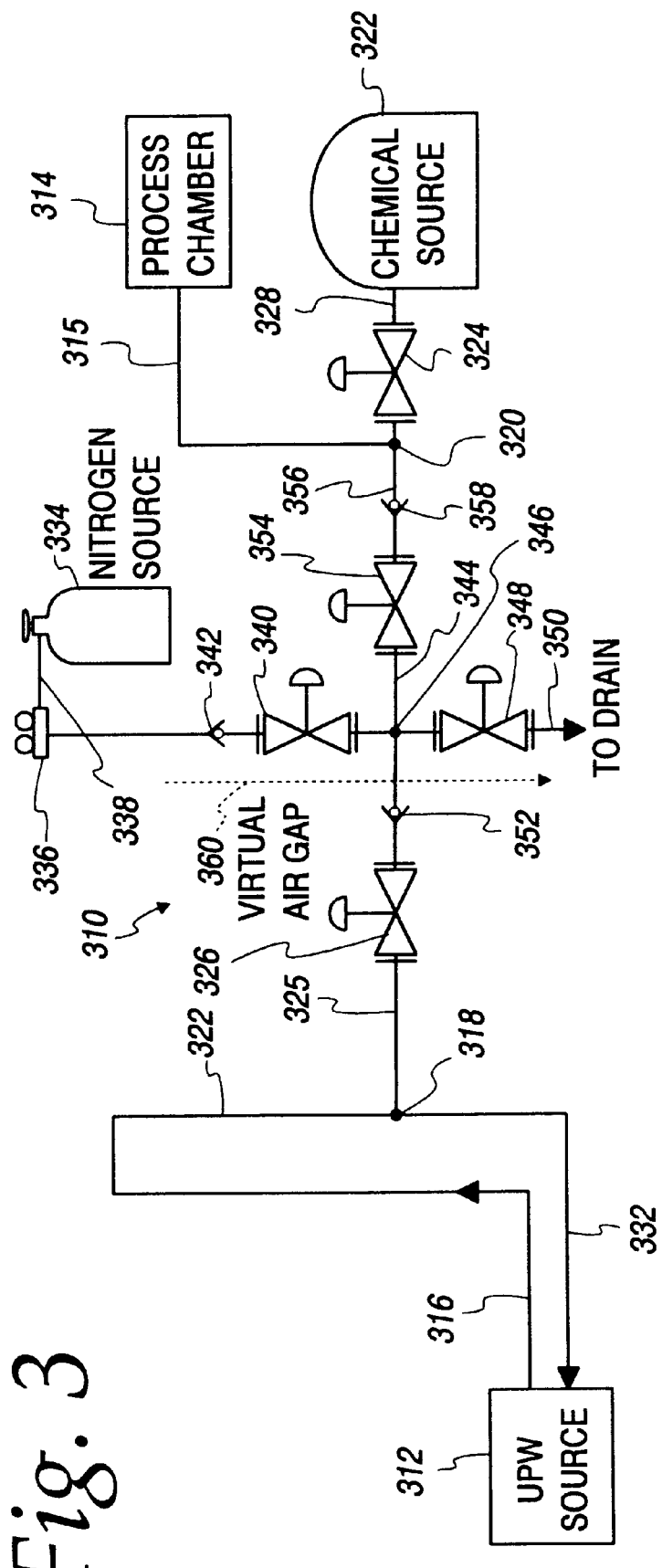
FIG. 3 is a schematic diagram of an isolation and protection system for preventing a UPW source from being contaminated, constructed in accordance with the principles of the present invention.

Referring now to FIG. 3 of the drawings, there is illustrated a schematic diagram of an improved isolation and protection system 310 for protecting a UPW system from contamination by a pressurized chemical plumbing system constructed in accordance with the principles of the present invention. The ultra-purified water (UPW) source is used to, for example, flush and/or rinse the chemical delivery line and the process chamber required in the wet processing cleaning and chemical distribution applications in semiconductor wafer fabrication facilities. However, unlike the prior art of FIG. 2, the UPW system is protected from contamination by the chemicals in the pressurized chemical plumbing system by means of a virtual air gap which eliminates the need of holding tanks and/or pumps.

The isolation and protection system 310 includes an ultra-purified water (UPW) source 312 from a factory such as a chemical plant or treatment plant which is supplied to a process chamber 314 via a chemical delivery line 315. The UPW source is utilized to flush and/or rinse the chemical delivery line 315 and the process chamber 314 after the chemicals therein have been drained. The UPW source 312 is fed to one end of a UPW supply or outlet pipe 316 whose other end is joined to a water connection joint 318. A first water connecting valve 326 has its one end connected also to the water connection joint 318 via a pipe 325.

The water connection joint 318 is also connected to the UPW source 312 via a UPW return or inlet pipe 332. The first water connecting valve 326 and the chemical delivery valve 324 are selectively opened and closed to allow switching between a chemical delivery mode of operation and a flushing/rinsing mode of operation. When the first water connecting valve 326 is closed and the chemical delivery valve 324 is opened, this is referred to as the "chemical delivery mode" in which the chemical source from the reservoir 322 is being supplied to the process chamber. When the first water connecting valve 326 is opened and the chemical delivery valve 324 is closed, this is referred to as the "flushing/rinsing" mode in which the UPW source is being supplied to the chemical delivery line 315 and the process chamber 314 so as to flush and rinse the same after the chemicals therein have been removed or drained.

As thus far described, the system 310 of FIG. 3 is identical to the prior art system of FIG. 2 and includes all of the same structural components. In order to create the virtual air gap of the present invention, there is provided the addition of a regulated filter nitrogen ($N_2$) source 334 which is connected to one side of a pressure regulator 336 by a nitrogen outlet pipe 338. The desired pressure of the nitrogen is regulated by the pressure regulator 336. The other side of the pressure regulator 336 is connected to one side of a first nitrogen valve 340 via first check valve 342. The other side of the nitrogen valve 340 is connected to a main manifold 344 via a connecting joint 346.

A second nitrogen valve 348 has its one end connected to the same connecting joint 346 and its other end connected to a drain pipe 350. The other end of the first water valve 326 is connected to the main manifold 344 at the same connecting joint 346 via a second check valve 352. A second water connecting valve 354 has its one end connected to the main manifold downstream from the connecting joint 346. The other end of the second water connecting valve 354 is connected via a third check valve 358, a water/chemical connection joint 320, and the chemical delivery line 315 to the process chamber 314.

The pressurized reservoir 322 containing a source of chemicals is connected to one end of a chemical delivery valve 324 via a chemical outlet pipe 328. The other end of the chemical delivery valve 324 is also connected to the water/chemical connection joint 320.

Prior to the flushing/rinsing mode of operation, the chemical delivery valve 324 is turned off and the chemical in the process chamber 314 is drained so as to remove the chemicals therein. Then, in the flushing mode of operation the first water valve 326 and the second water valve 354 will both be opened. In addition, the first nitrogen valve 340 and the second nitrogen valve 348 will both be closed. As a result, the UPW source flowing in the pipe 325 will be passed through the valves 326 and 352, the connecting joint 346, the main manifold 344, the valves 354 and 358, the water/chemical connection joint 320, and the chemical delivery line 315 into the process chamber 314 so as to flush or rinse out the chemical residue therein.

In the chemical delivery mode of operation (i.e., when the UPW source is not being used to flush the reservoir), the first water valve 326 and the second water valve 354 will both be closed. In addition, the first nitrogen valve 340 and the second nitrogen valve 348 are both opened so as to permit the regulated nitrogen source 334 to flow from the nitrogen outlet pipe 338 through the regulator 336; valves 342, 340; connecting joint 346; and the valve 348 to the drain pipe 350. As a result, there will be produced a steady flow of nitrogen which creates the virtual air gap as indicated by the arrow 360. Next, the chemical delivery valve 324 is turned on so as to permit the supply of the chemical source from the reservoir 322 to flow to the process chamber 314 via the chemical delivery line 315.

In the present invention, the arrangement of the nitrogen source and the valves 342, 340 and 348 between the UPW source 312 and the reservoir 322 of the chemical source as described and operated above to produce the virtual air gap has eliminated any requirement of holding tanks and/or pumps as in the prior art configuration of FIG. 2 used to prevent the undesirable backflow of chemicals to the UPW source. This advantage provides a very significant savings of space due to the limited amount of area typically available in a semiconductor wafer fabrication facility. Further, the additional components of the nitrogen source and valves can be connected to a conventional existing system without major modifications so as to permit retro-fitting. Moreover, these extra components are relatively less expensive in cost than the holding tank and/or pumps used in the prior art.

From a total failure point of view which would allow the backflow of the chemicals in the reservoir 322 to flow back into the UPW source 312, it should be appreciated by those skilled in the art that all of the valves 326, 352, 354 and 358 must either fail or leak and that either of the valves 342, 340 must fail to deliver nitrogen or the valve 348 must fail to open. For safe operating conditions, the pressure setting of the chemical source in the reservoir 322 should be less than the pressure setting of the UPW source 312. Further, the pressure of the nitrogen source 334 should also be set to be less than the pressure setting of the UPW source, but yet be greater than the pressure setting of the chemical source.

Figure 4:
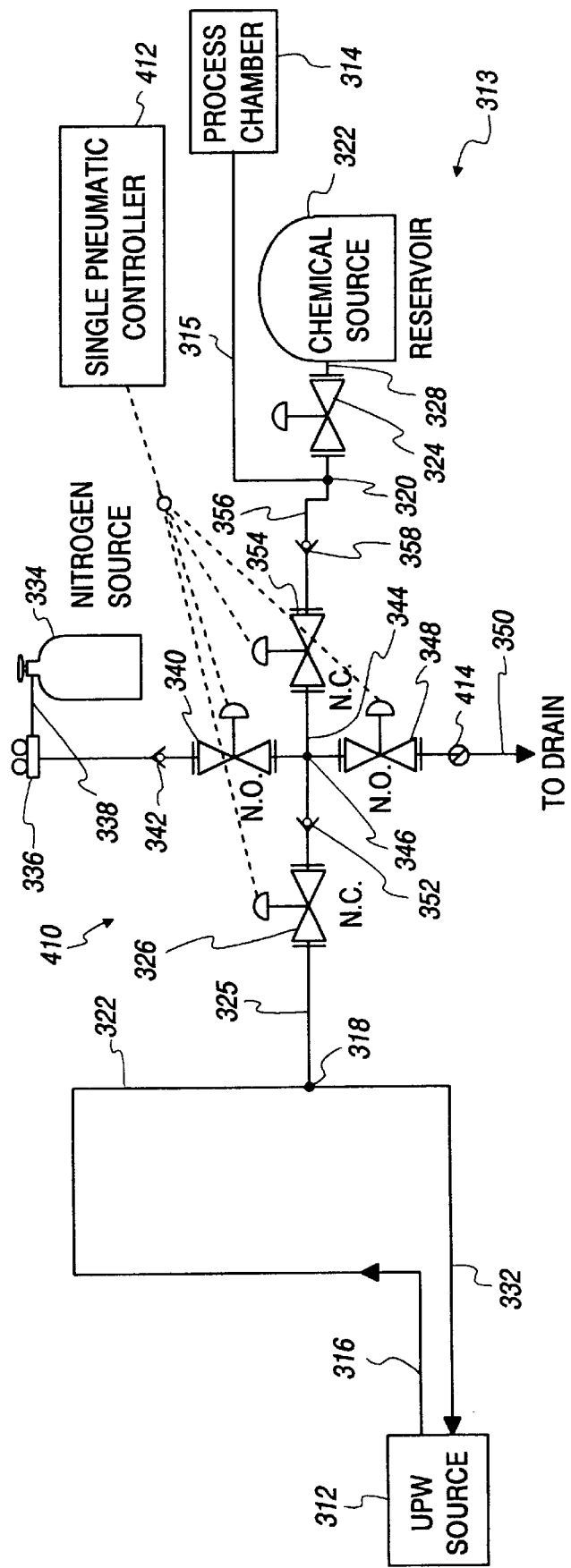
FIG. 4 is a schematic diagram of a second embodiment of an isolation and protection system in accordance with the present invention.

In FIG. 4, there is shown a schematic diagram of a second embodiment of an isolation and protection system 410 in accordance with the present invention. The system 410 includes all of the same components as in the system 310 of FIG. 3 and further has a single pneumatic controller 412 for actuating all of the valves 340, 348, 326 and 354. This is achieved in the present invention by selecting the nitrogen valves 340, 348 to be normally-opened, pneumatically-controlled valves and the UPW valves 326, 354 to be normally-closed, pneumatically-controlled valves.

In operation, when the controller is de-activated or not energized the nitrogen source will be passed through the normally-opened valves 340, 348 so as to create the virtual air gap during the chemical delivery mode. On the other hand, when the controller is activated and all of the valves are energized the UPW source will be passed through the normally-closed UPW valves 326, 354, that will now be opened, to flush or rinse the chemical delivery line 315 and the process chamber 314. Optionally, in order to monitor that the nitrogen source 334 is being delivered to create the virtual air gap during the chemical delivery mode, a nitrogen flow sensor 414 is preferably connected between the other side of the second nitrogen valve 348 and the drain pipe 350.

It should be understood that the UPW or water valves 326 and 354; nitrogen valves 340 and 348; and check valves 342, 352, 358 illustrated in FIGS. 3 and 4 of the present invention are conventional components and may be of the type similar to those commercial available from Fluoroware, Inc. of Chaska, Minn. Similarly, the pressure regulator 336 and the nitrogen flow sensor 414 are quite standard in the industry and are preferably of the type that are manufactured and sold by Veriflow Corporation of Richmond, Calif., and Futurestar Corporation of Edina, Minn., respectively.

From the foregoing detailed description, it can thus be seen that the present invention provides an improved isolation and protection system for preventing a source of ultra-purified water from being contaminated with chemicals. The system includes a source of ultra-purified water and a chemical source. A source of gas under pressure is passed between the source of ultra-purified water and the chemical source so as to create a virtual air gap to prevent backflow of the chemical source into the source of ultra-purified water causing contamination thereof during the chemical delivery mode of operation.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

We claim:

1. An isolation and protection system for preventing a source of ultra-purified water from being contaminated with chemicals, comprising:

a source of ultra-purified water;

a reservoir containing a chemical source, said reservoir having a chemical delivery valve and a chemical outlet pipe coupled to a chemical delivery line for supplying chemical to a process chamber during a chemical delivery mode of operation;

first controllable inlet valve means having its outlet coupled to said chemical delivery line and said source of ultra-purified water for supplying the ultra-purified water from said srource of ultra-purified water to said process chamber during a flushing mode of operation and an inlet;

second controllable inlet valve means having an outlet coupled to the inlet of said first controllable inlet valve means and an inlet coupled to said source of ultra-purified water;

means coupled between said outlet of said second controllable inlet valve means and said inlet of said first controllable inlet valve means for creating a virtual air gap so as to prevent backflow of the chemical source from said reservoir into said source of ultra-purified water causing contamination thereof during the chemical delivery mode of operation; and said means-for creating the virtual air gap including a source of gas under pressure, a third controllable inlet valve means, and a fourth controllable inlet valve means, said third controllable inlet valve means having its inlet coupled to the source of gas under pressure and an outlet, said fourth controllable inlet valve means having its inlet coupled to the outlet of said third controllable inlet valve means and its outlet coupled to a drain pipe, said fourth controllable inlet valve means having its inlet coupled also to said outlet of said second controllable inlet valve means and said inlet of said first controllable inlet valve means.

2. An isolation and protection system as claimed in claim 1, wherein said source of gas under pressure is nitrogen.

3. An isolation and protection system as claimed in claim 1, further comprising first, second and third check valves coupled to said source of ultra-purified water, said source of gas, and said chemical source so as to prevent the flow of the chemical source into said source of gas and said source of ultra-purified water and to prevent the flow of gas into said ultra-purified water and said chemical source.

4. An isolation and protection system as claimed in claim 2, wherein said first and second controllable inlet valve means are closed and said third and fourth controllable inlet valve means are opened so as to allow the flow of said nitrogen to said drain pipe during the chemical delivery mode of operation.

5. An isolation and protection system as claimed in claim 4, wherein the pressure of nitrogen is greater than the pressure of the chemical source.

6. An isolation and protection system as claimed in claim 5, wherein the pressure of nitrogen is less than the pressure of the source of ultra-purified water.

7. An isolation and protection system as claimed in claim 4, wherein said first and second controllable inlet valve means are normally-closed, pneumatically-controlled valves and said third and fourth controllable inlet valve means are normally-closed, pneumatically-controlled valves.

8. An isolation and protection system as claimed in claim 4, further comprising single controller means for activating said first through fourth valves so as to switch between the chemical delivery mode of operation and the flushing mode of operation.

9. A method of preventing a source of ultra-purified water from being contaminated with chemicals, comprising the steps of:

providing a source of ultra-purified water;

providing a process chamber;

supplying the ultra-purified water from said source of ultra-purified water to said process chamber during a flushing mode of operation;

providing a chemical source;

supplying chemical from said chemical source to said process chamber during a chemical delivery mode of operation; and passing a source of gas under pressure between said source of ultra-purified water and said chemical source so as to create a virtual air gap to prevent backflow of the chemical source into said source of ultra-purified water causing contamination thereof during the chemical delivery mode of operation.

10. A method as claimed in claim 9, wherein said source of gas under pressure is nitrogen.

11. A method as claimed in claim 10, wherein the pressure of nitrogen is greater than the pressure of the chemical source.

12. A method as claimed in claim 11, wherein the pressure of nitrogen is less than the pressure of the source of ultra-purified water.

* * * * *

UNITED STATES PATENT AND TRADEMARK OFFICE
CERTIFICATE OF CORRECTION

PATENT NO : 5,944,043
DATED : August 31, 1999
INVENTOR(S): Jeffrey S. Glick et al.

It is certified that error appears in the above-identified patent and that said Letters Patent is hereby corrected as shown below:

Column 6, line 24, change "srource" to --source--;

Column 6, line 38, change "means-for" to --means for--.

Signed and Sealed this

Twenty-ninth Day of February, 2000

Attest:

Q. TODD DICKINSON

Attesting Officer

Commissioner of Patents and Trademarks